United States Patent [19]

Paoli

[11] Patent Number: 5,317,170

[45] Date of Patent: * May 31, 1994

[54] HIGH DENSITY, INDEPENDENTLY ADDRESSABLE, SURFACE EMITTING SEMICONDUCTOR LASER/LIGHT EMITTING DIODE ARRAYS WITHOUT A SUBSTRATE

[75] Inventor: Thomas L. Paoli, Los Altos, Calif.

[73] Assignee: Xerox Corporation, Stamford, Conn.

[*] Notice: The portion of the term of this patent subsequent to May 11, 2010 has been disclaimed.

[21] Appl. No.: 45,400

[22] Filed: Apr. 13, 1993

Related U.S. Application Data

[63] Continuation-in-part of Ser. No. 620,229, Nov. 29, 1990, Pat. No. 5,216,263.

[51] Int. Cl.$^5$ .................. H01L 33/00; H01L 29/161; H01L 27/02; H01L 29/06
[52] U.S. Cl. ........................................ 257/88; 257/93; 257/94; 257/95; 372/50
[58] Field of Search ................... 257/88, 93, 94, 95, 257/183, 506; 372/43-46, 50; 350/96

[56] References Cited

U.S. PATENT DOCUMENTS

| | | | |
|---|---|---|---|
| 4,870,652 | 9/1989 | Thornton | 372/50 |
| 5,031,187 | 7/1991 | Orenstein et al. | 372/50 |
| 5,073,041 | 12/1991 | Rastani | 385/33 |
| 5,216,263 | 6/1993 | Paoli | 257/95 |

FOREIGN PATENT DOCUMENTS 60-76117 9/1985 Japan .

OTHER PUBLICATIONS

Yablonitch et al., "Double Heterostructure GaAs/AlGaAs Thin Film Diode Lasers on Glass Substrates", IEEE Photonics Technology Letters, vol. 1, No. 2, pp. 41-42, Feb. 1989.

Tell et al., "High-Power cw Vertical-Cavity Top Surface-Emitting GaAs Quantum Well Lasers", *Applied Physics Letters*, vol. 57, No. 18, pp. 1855-1857, Oct. 29, 1990.

Rastani et al., "Arrays of Fucsed Beams . . . ", *Spatial Light Modulators and Applications*, 1990 Technical Digest, vol. 14, pp. 76-79, Sep. 10-12, 1990.

Chang-Hasnain et al., "Surface Emitting Laser Arrays with Uniformly Separated Wavelengths", *Electronics Letters*, vol. 26, No. 13, pp. 940-942, Jun. 21, 1990.

Jewell et al., "Low-Threshold Electrically Pumped Vertical-Cavity Surface-Emitting Microlasers", *Electronics Letters*, vol. 25, No. 17, pp. 1123-1124, Aug. 17, 1989.

*Primary Examiner*—Mark V. Prenty
*Attorney, Agent, or Firm*—William Propp

[57] ABSTRACT

A high density surface emitting semiconductor LED array comprises disordered regions extending through a second contact layer, second confinement layer, an active layer and partially extending through a first confinement layer to define light emitting areas therebetween the disordered regions. Individual contacts on the second contact layer aligned with each emitting area inject current through the layers to a common contact on a first contact layer causing emission of light from the active layer through the surface of the exposed first contact layer. The second confinement layer can be replaced with a DBR to form an enhanced LED array. Both confinement layers can be replaced with DBRs to form a laser array. A refractive semiconductor layer, fresnel lenses or a micro lens array can be used to optically modify the surface emitted light. The semiconductor laser/light emitting diode arrays are fabricated without a substrate.

38 Claims, 7 Drawing Sheets

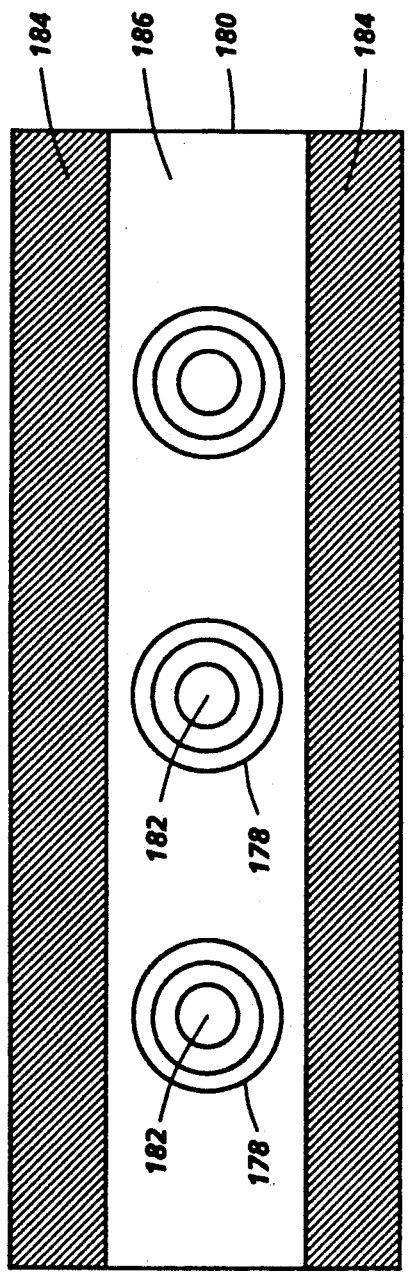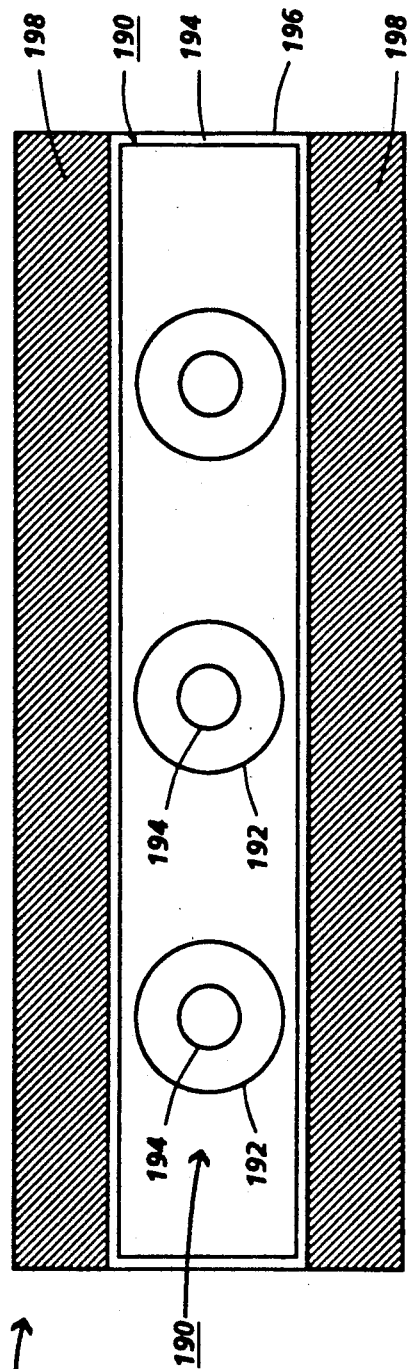

HIGH DENSITY, INDEPENDENTLY ADDRESSABLE, SURFACE EMITTING SEMICONDUCTOR LASER/LIGHT EMITTING DIODE ARRAYS WITHOUT A SUBSTRATE

This application is a continuation-in-part of copending, coassigned U.S. patent application Ser. No. 07/620,229 of Thomas L. Paoli, entitled "HIGH DENSITY, INDEPENDENTLY ADDRESSABLE, SURFACE EMITTING SEMICONDUCTOR LASER/LIGHT EMITTING DIODE ARRAYS," filed Nov. 29, 1990, now U.S. Pat. No. 5,216,263.

BACKGROUND OF THE INVENTION

This invention relates to a surface emitting semiconductor laser/light emitting diode structure and, more particularly, to a high density surface emitting semiconductor structure without a substrate with independently addressable individual light emitting elements.

The ability to fabricate closely spaced, or high density, independently addressable laser and light emitting diode (LED) sources is important for many applications such as optical disk technology, laser printing and scanning, optical interconnection and fiber optic communications.

Individually, semiconductor light emitting diodes and semiconductor lasers are low power output devices. Arrays of semiconductor light emitting diodes or semiconductor lasers can be used to increase the power output and to simplify optical system design. To provide and maintain good optical alignment of the light emitting elements of the array with one another and to minimize the assembly involved, arrays have been fabricated so that the light emitting elements are in a single semiconductor substrate.

One problem with such arrays is maintaining the electrical and optical isolation between the individual light emitting elements. Another problem is increasing the density of the light emitting elements in the substrate by closely spacing the elements together while still maintaining the isolation, avoiding heat dissipation problems, and providing precise alignment of the elements.

Another problem is making each individual light emitting element in the array independently addressable. As the light emitting elements are spaced closer together in higher densities, it is progressively more difficult to separately, individually and independently cause each element to emit light.

Typical laser and LED sources have been edge emitters. The light is emitted from the edge of a monolithic structure of semiconductor layers. An alternative construction is surface emitters where the light is emitted from the surface of the monolithic structure of semiconductor layers.

Surface emitting semiconductor light sources have several advantages over edge emitters. The light emitting surface of a surface emitter is larger than that of an edge emitter. The power needed to cause emission of light is less for a surface emitter than an edge emitter. Surface emitting LEDs are more efficient than edge emitting LEDs because they have that larger emitting area. Fabrication of surface emitting lasers can be less complex than fabrication of edge emitting lasers since the cleaving and mirror passivation needed for edge emitters are eliminated.

If the individual contacts that make the surface emitters of the array independently addressable are on the same side of the semiconductor as the light emitting surface, the lateral spacing between the surface emitting light sources is restricted and consequently the density of the array is limited. The diameter of the contact will be larger than the diameter of the emitting surface. Annular contact shapes are also more difficult to contact while maintaining a clear aperture for the emitting surface. For direct wire bonds the contacts may require an auxiliary pad. Same surface contacts and emitting surfaces also may increase the amount of heat generated and may cause dissipation problems.

The individual contacts that make the surface emitters of the array independently addressable should also be directly aligned with the light emission optical cavity. Alignment is advantageous because it minimizes the electrical resistance, the current spreading to each emitter, and the size of the electrode. It also places the heatsinking as close to the emitting area as possible. Minimizing current spreading helps electrically isolate the individual elements.

Prior embodiments of the laser/light emitting diode array have all been fabricated on a substrate which remains part of the diode array structure. The substrate provides structural strength and rigidity to the complete semiconductor structure. Substrates are typically 75 to 100 microns thick which greatly increases the size of the semiconductor structure. If the laser/light emitting diode array is a surface emitter and the substrate is between the surface and the light generation layer, then the substrate must be removed by some means to expose the underlying surface emitters to permit the emission of light through the surface or the substrate must have a high bandgap and low doping level to facilitate light emission. To enable efficient heatsinking of the array, it is advantageous to mount the epitaxial layers of the diode structure in contact with the heatsink. This mounting orientation then requires light output to be obtained either through the heatsink or from the substrate side.

A method has been disclosed recently by Yablonitch et al., ("Double Heterostructure GaAs/AlGaAs Thin Film Diode Lasers on Glass Substrates", *IEEE Photonics Technology Letters*, Vol. 1, No. 2, pp. 41–42, February 1989) for liftoff of an epitaxially deposited semiconductor structure from a temporary substrate.

It is an object of this invention, therefore, to provide a high density array of light source surface emitters without a substrate.

It is a further object of this invention to provide a means for independent addressing of the individual laser or light emitting diode elements in this high density array.

It is yet another object of this invention to provide the independently addressable, individual contacts of the array on the opposite surface of the surface emitting semiconductor light source from the light emission surface.

It is still another object of this invention to provide that the independently addressable, individual contacts of the array are directly aligned with the light emission optical cavities and thereby maximize the density of emitters.

SUMMARY OF THE INVENTION

In accordance with the present invention, a high density surface emitting semiconductor LED array comprises a first confinement layer and a first contact layer of one conductivity type, an active layer, a second confinement layer and a second contact layer of an opposing conductivity type. Disordered regions extend from the second contact layer through to the first confinement layer defining light emitting areas therebetween. The light emitting areas can be laterally shaped for optimum use. Individual contacts on the first contact layer aligned with each light emitting area inject current through the light emitting area to a common contact on the first confinement layer causing emission of light from the active layer in the light emitting area through the surface of the first contact layer. The semiconductor laser/light emitting diode arrays are fabricated without a substrate.

The second confinement layer can be replaced with multiple layers making a highly reflective mirror known as a distributed Bragg reflector (DBR) to form an enhanced LED array. Both confinement layers can be replaced with DBRs to form an optical cavity, instead of a light emitting area, and a laser array rather than a LED array. Similarly, either or both DBRs can be replaced with a confinement layer and a high reflectivity coating.

A transparent refractive layer can be deposited on the first confinement layer or the first DBR to diverge the emitted light. Alternately the output surface of the first contact layer, the first confinement layer, the first DBR or the refractive layer can be etched to form a Fresnel lens for collimating or focussing the laser output. A micro lens array can be positioned adjacent to the surface emitting areas. The semiconductor laser/light emitting diode arrays can also be formed into two-dimensional arrays.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 7 is a schematic illustration of a bottom view of an alternate embodiment of the high density, independently addressable, surface emitting, semiconductor laser or LED array with individual Fresnel lenses and no substrate formed according to this invention.

FIG. 8 is a schematic illustration of a bottom view of an alternate embodiment of the high density, independently addressable, surface emitting, semiconductor laser or LED array with a micro lens array and no substrate formed according to this invention.

DESCRIPTION OF THE PREFERRED EMBODIMENT

Reference is now made to FIG. 1, wherein there is illustrated a high density, independently addressable, surface emitting semiconductor LED array 10 of this invention.

Figure 1A:
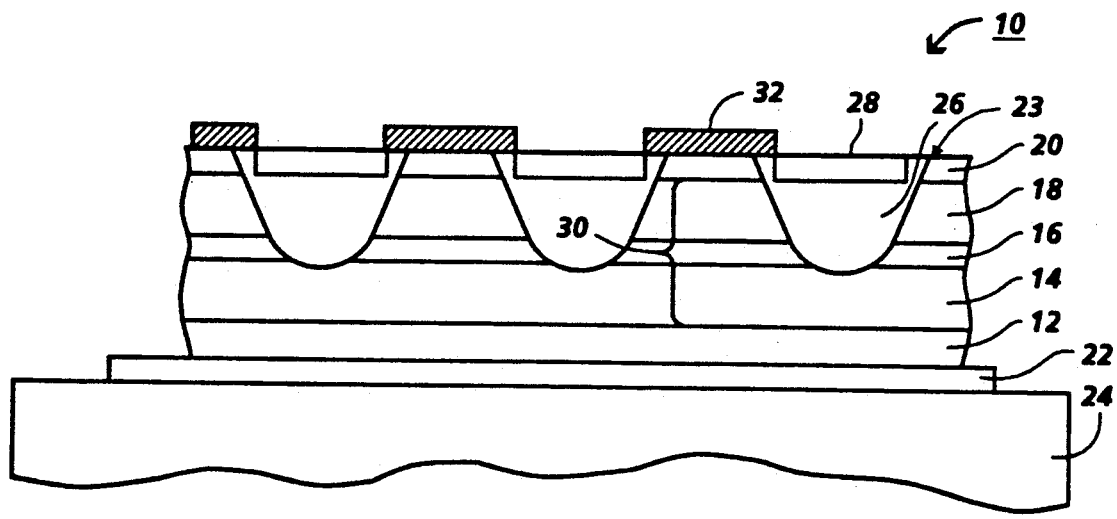
FIGS. 1A and 1B are schematic illustrations of a side view of a high density, independently addressable, surface emitting, semiconductor LED array without a substrate formed according to this invention.

LED array 10 in FIG. 1A comprises a first contact layer 12 of n-GaAs upon which is epitaxially deposited a first confinement layer 14 of n-$Al_xGa_{1-x}As$, an active layer 16 of nondoped GaAs for generating light waves, a second confinement layer 18 of p-$Al_yGa_{1-y}As$ where x may or may not equal y, and a second contact layer 20 of p-GaAs. LED array 10 is fabricated using the epitaxial liftoff method described in detail below, wherein a release layer 22 of n-AlAs is deposited on a growth substrate 24. The first contact layer 12 is then deposited on the release layer 22 with the remaining semiconductor layers of the LED array 10 epitaxially deposited on the first contact layer. As will be discussed later, the release layer 22 is dissolved in order to detach the LED array 10 from the growth substrate 24.

The bandgap of the semiconductor material of the active layer 16 should be less than that of the first confinement layer 14 so that the first confinement layer is substantially transparent to the light generated in the active layer. The first confinement layer should also have a doping level as low as possible without introducing unnecessary resistance so that free carriers in the first confinement layer absorb a minimum amount of the light generated in the active layer.

Since the first contact layer 12 and the first confinement layer 14 have n-type conductivity, that side of the LED array from the active layer is referred to as the n-side of the LED array. Similarly, since the second confinement layer 18 and the second contact layer 20 have p-type conductivity, that side of the LED array from the active layer is referred to as the p-side of the LED array.

The active layer may, in the alternative, be nondoped or p-type doped or n-type doped; GaAs, $Al_zGa_{1-z}As$ or $(Al_zGa_{1-z})_{0.5}In_{0.5}P$; or a relatively thin conventional double heterostructure (DH) active layer; or a single quantum well, such as GaAs or $Al_zGa_{1-z}As$ where z is very small and $z<x$ and y; or a multiple quantum well superlattice, such as alternating layers of GaAs and $Al_zGa_{1-z}As$ where $z<x$ and y or alternating layers of $Al_wGa_{1-w}As$ and $Al_BGa_{1-B}As$ where $w<B<x$ or y (w for well and B for barrier). Also, in the alternative, any of the aforementioned active layers can be deposited between two semiconductor confinement layers of $Al_mGa_{1-m}As$ and $Al_nGa_{1-n}As$, where m may or may not equal n, but with bandgaps intermediate between the bandgaps of the active layer and the first and second confinement layers, in a separate confinement structure.

As is known in the art, the epitaxial growth of LED array 10 may be carried out by molecular beam epitaxy (MBE) or metalorganic chemical vapor deposition (MOCVD). The growth substrate 24 may be any sufficient thickness suitable for epitaxial liftoff of the semiconductor structure 10. The selective release layer 22 is approximately 50 nm thick. The confinement layers 14 and 18 may have a thickness in the range of 0.1 to 1 micron. A preferred embodiment uses a thin first confinement layer, typically 0.1 to 0.2 micron thick in order to place the active layer close to the light emitting surface. The active layer 16 may be a thin conventional layer having a thickness of 50 nanometers to 2 microns or may be comprised of a one or more quantum wells which may be 3 to 50 nanometers thick. The contact layers 12 and 20 are typically 10 to 100 nm thick.

There are alternate conventional techniques and atomic species for carrying out the desired layer disordering to form individual elements of the LED array. Discussion hereafter will be confined to impurity induced disordering. However, it should be noted that these other techniques such as elemental diffusions or implants are equally applicable.

Upon completion of the epitaxial growth and before removal of the epitaxial layers from the substrate, a $Si_3N_4$ mask is formed on the top surface 23 of the second contact layer 20 with openings exposing regions of the semiconductor structure to impurity induced disordering. The mask protects the unexposed regions which will form and shape the LED light emitting areas which can be circular, elliptical, square, parallelogramal, trapezoidal, triangular or any desired shape or size.

The light emitting areas are established by first selectively diffusing a high concentration n-impurity dopant, such as silicon, into the regions of the semiconductor structure exposed through the mask. Other n-impurity dopant elements would include Ge and Sn.

A silicon layer is deposited in the opening in the $Si_3N_4$ mask and then capped with an additional layer Of $Si_3N_4$. The diffusion of silicon is accomplished at a temperature of approximately 800° C. and is maintained for a sufficiently long period of time, e.g. seven to eight hours, to penetrate the second contact layer 20, the second confinement layer 18, the active layer 16, and partially penetrate the first confinement layer 14.

The diffusion of silicon through and into the active layer 16, the contact layer 20 and the confinement layers 14 and 18 causes an intermixing of Ga and Al in the active layer 16, the contact layer 20 and the confinement layers 14 and 18, thereby forming a n-impurity induced disordered region 26.

Upon completion of the impurity induced disordering steps, electrically insulating regions 28 are formed in the disordered regions 26 by proton implantation through the top surface 23 to provide a level of electrical isolation of the LED light emitting areas which allows independent addressability of each individual light emitting area.

Between the disordered regions 26 in the semiconductor LED array are the LED light emitting areas 30 consisting of the nondisordered sections of the second confinement layer 18, the active layer 16 and the first confinement layer 14. The disordered regions, optically and electrically, isolate and separate the light emitting areas. The light emitting areas are shaped by the confinement layers in the vertical direction and the shape of the disordered regions in the horizontal direction.

Standard photolithography and metal depositions are employed to form metal contacts 32 of Cr-Au or Ti-Pt-Au on the top surface 23 of the nondisordered second contact layer 20 aligned with each optical cavity 30. Each contact 32 separately, independently, and individually contacts an optical cavity. The contacts 32 are referred to as p-contacts since they are on the p-side of the LED array.

The contacts are typically circular or annular in shape for ease in forming high density arrays, although the contacts may also be elliptical, half-moon or other shapes. The individual contact can be equal in size or smaller than the active layer in the aligned light emitter area and can be shaped to match the nondisordered active layer or the light emitter area. The contact is shaped by shaping the hole in a metallization mask.

The shape of the contact is so that the contact has the largest area possible for minimizing electrical resistance without limiting the density of the emitters and to match the bonding pad for effective heatsinking. The nondisordered contact layer 20 beneath each contact 32 provides low contact resistance to the other semiconductor layers and minimizes the contact heating.

Figure 1B:
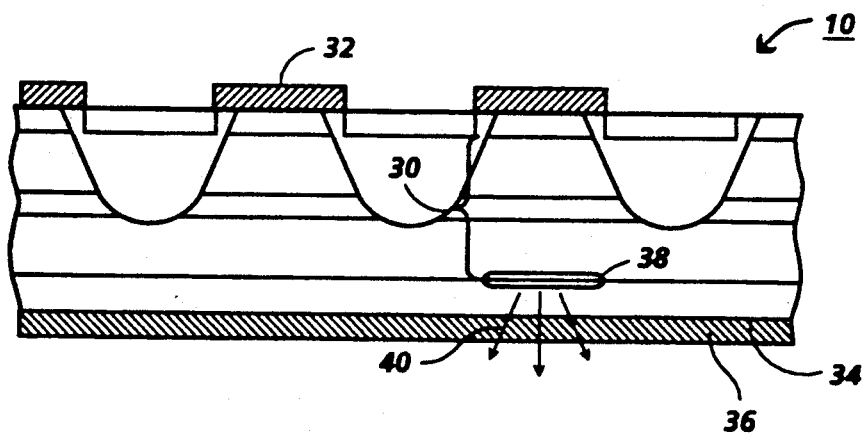

After the p-contacts are formed, the LED array is detached from substrate 24 by dissolving release layer 22 with dilute hydrofluoric acid. During dissolution, the p-contacts 32 may be protected with wax, for example. After detachment, the bottom surface 35 of the first contact layer 12 is exposed, as shown In FIG. 1B.

Figure 2:
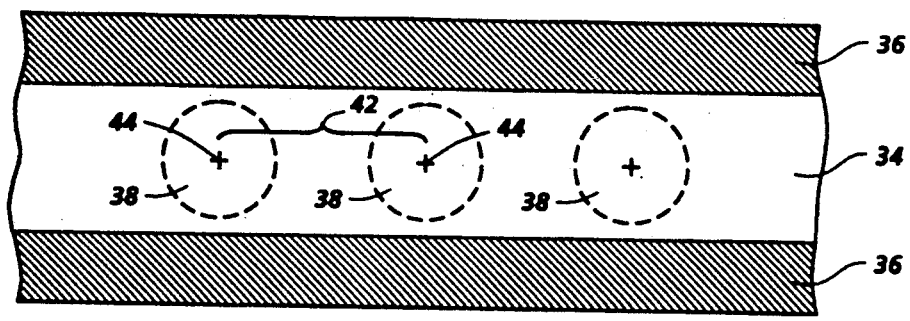
FIG. 2 is a schematic illustration of the bottom view of the LED array of FIG. 1B.

The bottom surface 34 of the first contact layer 12 is metallized with Au/Ge followed by Cr-Au or Ti-Pt-Au to form a striped contact 36. The contact 36 comprises two stripes running parallel to the row of surface emitters 38 on the bottom surface 34 of the first contact layer 12, as shown in FIG. 2. The striped contact is referenced to ground and referred to as the n-contact since it is on the n-side of the LED array. Since LED array 10 has been completely removed from its growth substrate, no additional material must be removed to expose the surface emitting area at the surface of the first contact layer. The surface emitting area 38 is already exposed between the n-contacts 36.

Returning to FIG. 1B, current is injected between the p-contact 32 and the n-contact 36 to forward-bias the p-n junction of p-confinement layer 18 and n-confinement layer 14 to cause the active layer 16 to emit light 40 from the light emitting area 30. The current is injected substantially parallel to the LED light emitting area 30, through the p-contact 32, the p-contact layer 20, the p-confinement layer 18, the active layer 16 of the individual light emitting area, and then spreads in the n-confinement layer 14 and the n-contact layer 12 and into the n-contact 36.

The ground or n-contact is common to all the light emitting areas. However, each light emitting area or LED element contains a p-n junction that is biased separately from all the other through its p-contacts. Since each p-contact is positively biased with respect to ground, current flows only from each p-contact to ground. The electrically isolating regions and the disordered regions prevents any single p-contact from causing adjacent light emitting areas to emit light. Flow between different p-contacts does not occur because any small potential difference between the addressed p-contact and an adjacent p-contact corresponds to a reverse voltage on one of the neighboring p-n junctions formed by the Si diffusion.

The light 40 is emitted through the emitter surface area 38, substantially perpendicular to the bottom surface 34 of the first contact layer 12 and aligned with the p-contact 32 and the LED light emitting area 30. Hence LED array 10 is a surface emitting LED. The p-contact 32, aligned with the light emitting area 30, prevents light from being emitted by the light emitting area through the p-side of the LED array.

The shape of the emitter surface area and the resulting emitted light is determined by the shape of the LED light emitting areas which can be circular, elliptical, square, parallelogramal, trapezoidal, triangular or any desired shape or size. The emitted light itself can be either continuous wave or pulse.

Typically, the LED array 10 has an operating current of about 10 milliamperes with an output power of about 30 microwatts per individual light emitting element.

FIG. 2 is the bottom view of the LED array 10 of FIG. 1B, showing the bottom surface 34 of the first contact layer with the striped n-contacts 36 and the array of circular emitter surface areas 38 of the LED light emitting areas where the light is emitted through the surface between the n-contacts. The n-contact or ground contact need not be two stripe contacts for each row of emitters as shown in FIG. 2. The contacts can be a single stripe. The contacts can also be squares or other geometrical shapes either in pairs on either side of an emitter or singularly on one side. The use of pairs of contacts like the two stripe contacts shown in FIG. 2 is preferred for purposes of symmetry, ease of manufacture and uniformity of pumping.

Optical absorption in the first contact layer 12 may impede emission of the light from the active layer of the LED array. To avoid this impediment, the active layer 16 can be made of semiconductor material with a bandgap less than the bandgap of the first contact layer 12. However it is a significant feature of this invention that first contact layer 12 is n-type GaAs. As is well-known, for example see *Heterostructure Lasers: Part A*, by H. C. Casey, Jr. and M. B. Panish, (Academic Press, 1978), p. 46, increased doping in n-type material substantially lowers its optical absorptions at wavelengths where GaAs active layers emit light. This is in marked contrast to the behavior of p-type material where the optical absorption remains relatively high as the doping level is increased. Consequently, an n-contact layer with thickness of 0.1 $\mu$m will absorb less than 1% of the emitted light which may be considered insignificant.

Alternatively, in applications where this absorption is undesirable, the first contact layer can be removed in the regions of the emitting areas 38. Prior to the formation of the n-contacts 36, a shallow trough (not shown) or stripe is etched through the first contact layer 12, by standard chemical etching means or other techniques, to expose the surface of the first contact layer 12 and thereby facilitate light emission from the emitting areas therebeneath. The exposed surface of the first confinement layer or the first contact layer may also be coated with an anti-reflective coating to also facilitate light emission.

The processing of the LED array 10 is done from both the p-side and the n-side of the LED array.

The diameters of the emitter surface areas 38 are typically 2 microns or less. The spacing 42 from the center 44 of one individual LED element to the center 44 of the next LED element as measured from the emitter surface areas 38 is 3 microns or less which provides for a high density of LEDs in the array. The impurity induced disordering provides accurate and closer center to center spacing of the individual LED elements.

Since the individually addressable contacts, the p-contacts, are not on the same surface as the light emitting areas, the lateral spacing of the light emitting elements is slightly closer. Also, the light emitter geometry can be staggered or offset if the p-contacts and the light emitter areas are also staggered, rather than the straight line of p-contacts and LED emitter surface areas shown in the Figure. A staggered or offset geometry, of course, provides a higher density of LED elements.

In FIG. 3, enhanced LED array 46 is of identical structure to the LED array 10 of FIG. 1, except that the p-confinement layer 18 of FIG. 1 has been replaced by a distributed Bragg reflector (DBR) 48 in FIG. 3.

Figure 3A:
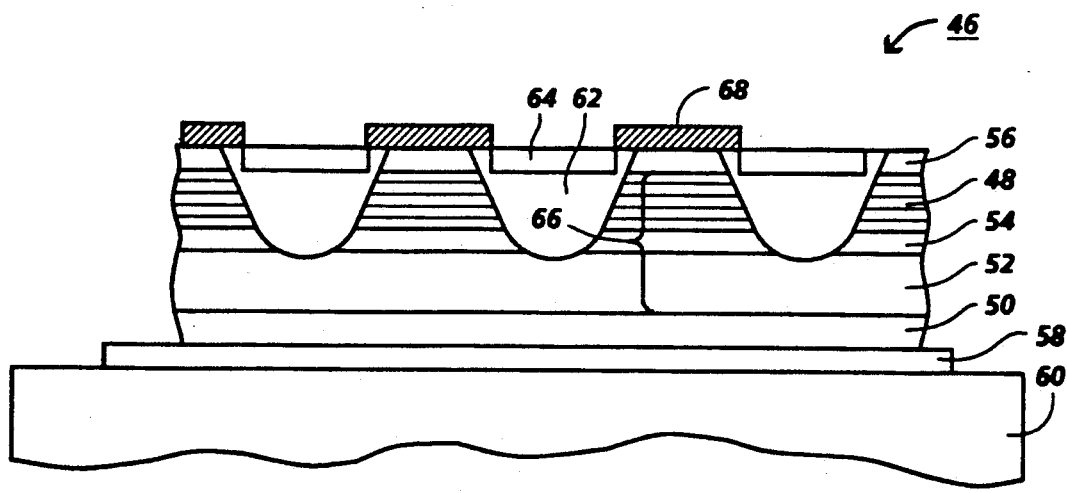
FIGS. 3A and 3B are schematic illustrations of a side view of an enhanced, high density, independently addressable, surface emitting, semiconductor LED array without a substrate with a DBR formed according to this invention.

Enhanced LED array 46 of FIG. 3A comprises a first contact layer 50 of n-GaAs upon which is epitaxially deposited a first confinement layer 52 of n-$Al_xGa_{1-x}As$, an active layer 54 of nondoped GaAs for generating light waves, a p-DBR 48 of alternating layers of p-$Al_yGa_{1-y}As$ and p-$Al_zGa_{1-z}As$ where $z \neq y$, and a second contact layer 56 of p-GaAs. Enhanced LED array 46 is fabricated using the epitaxial liftoff method described previously, wherein a release layer 58 of n-AlAs is deposited on a growth substrate 60. The first contact layer 50 is then deposited on the release layer 58 with the remaining semiconductor layers of the enhanced LED array 46 epitaxially deposited on the first contact layer. The release layer 58 will be dissolved in order to detach the enhanced LED array 46 from the growth substrate 60.

N-impurity induced disordered regions 62 are formed in the enhanced LED array 46 extending through the second contact layer 56, the p-DBR 48, the active layer 54 and a portion of n-confinement layer 52. Electrical isolating regions 64 are formed on the top surface of the disordered regions.

Between the disordered regions 62 in the enhanced LED array 46 are the enhanced LED light emitting areas 66 consisting of the nondisordered sections of the p-DBR 48, the active layer 54 and the n-confinement layer 52. The p-DBR is constructed to have a reflectivity as close to one as possible.

P-contacts 68 are formed on the p-contact layer 56 in alignment with each enhanced LED light emitting area 66.

Figure 3B:
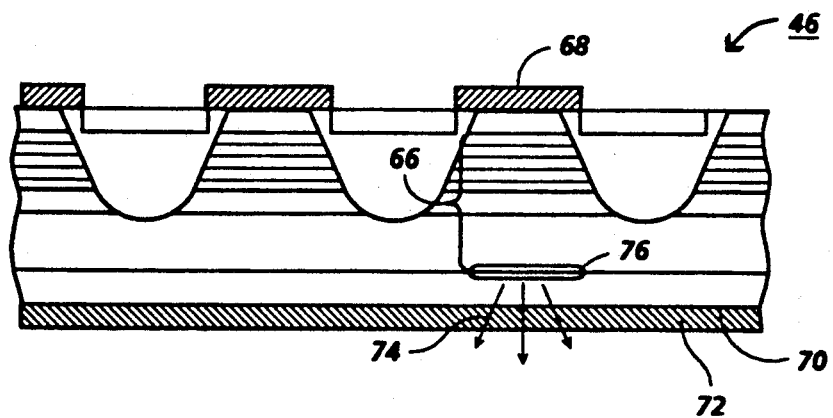

After the p-contacts are formed, the enhanced LED array 46 is detached from substrate 60 by dissolving the release layer 58 with dilute hydrofluoric acid. During dissolution, the p-contacts 68 may be protected with wax, for example. After detachment as shown in FIG. 3B, the bottom surface 70 of the first contact layer 50 is exposed.

The bottom surface 70 of the first contact layer 50 is metallized with Au/Ge followed by Cr-Au or Ti-Pt-Au to form a striped n-contact 72. The contact comprises two stripes running parallel to the row of surface emitters on the bottom surface of the first contact layer, as shown in FIG. 2. The striped contact is referenced to ground. Since enhanced LED array 46 has been completely removed from its growth substrate, no additional material must be removed to expose the surface emitting areas at the surface of the first contact layer between the n-contacts.

The light 74 is emitted through the emitter surface area 76 on the bottom surface 70 of the n-contact layer 50, substantially perpendicular to the bottom surface 70 of the substrate 50. The p-DBR reflects the light emitted by the active layer toward the p-side of the LED array back through the surface area on the n-side of the LED array, thus enhancing the amount of light emission from the light emitting areas.

Optical absorption in the first contact layer 50 may impede emission of the light from the active layer 54 of the enhanced LED array 46. To avoid this impediment, the active layer can be made of semiconductor material with a bandgap less than the bandgap of the contact layer. In applications where this is not possible, the first contact layer is made as thin as possible as described previously. Alternatively, the first contact layer can be removed in the regions of the emitting areas as described previously to facilitate light emission. The exposed surface of the first contact or first confinement layer at the emitter surface area may also be coated with an anti-reflective coating to also facilitate light emission. Typically, the enhanced LED array 46 has an operating current of about 10 milliamperes with an output power of about 60 microwatts.

Alternatively, the active layer 54 can be in a separate confinement structure to keep the carriers away from the DBR. Also alternatively, the p-confinement layer 18 of FIG. 1 may be coated with a highly reflective metal which serves as an electrically conductive, optical reflector to form an enhanced LED array.

In FIG. 4, laser array 78 is of identical structure to the enhanced LED array 46 of FIG. 3, except that the n-confinement layer 52 of FIG. 3 has been replaced by a DBR 80 and that active layer 54 of FIG. 3 which provides lightwave generation has been replaced by active layer 82 in FIG. 4 which provides lightwave generation and propagation under lasing conditions.

Figure 4A:
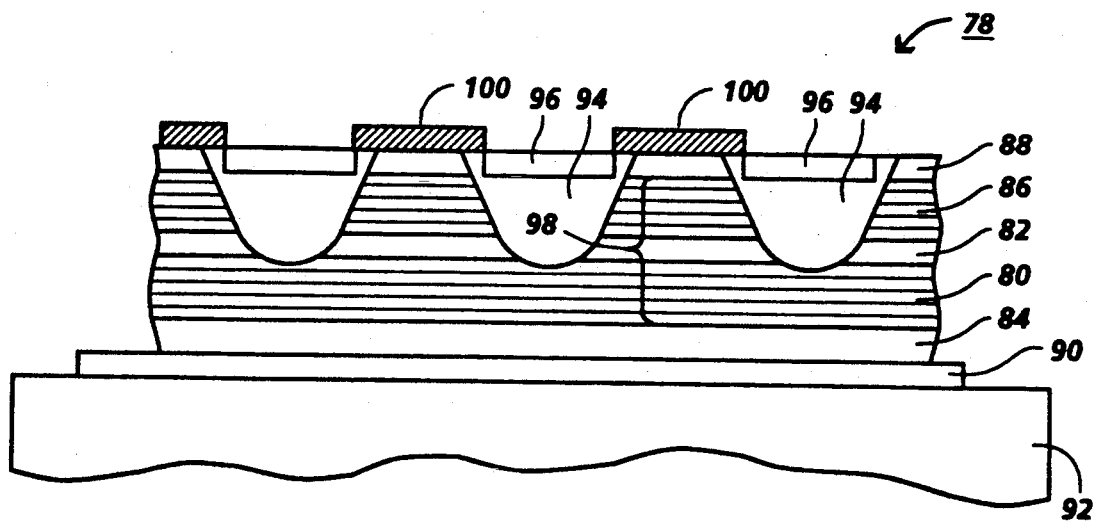
FIGS. 4A and 4B are schematic illustrations of a side view of a high density, independently addressable, surface emitting, semiconductor laser array without a substrate formed according to this invention.

Laser array 78 of FIG. 4A comprises a first contact layer 84 of n-GaAs upon which is epitaxially deposited an n-DBR 80 of alternating layers of n-$Al_xGa_{1-x}As$ and n-$Al_yGa_{1-y}As$ where $x \neq y$, an active layer 82 of nondoped GaAs for generating and propagating light waves under lasing conditions, a p-DBR 86 of alternating layers of p-$Al_AGa_{1-A}As$ and p-$Al_BGa_{1-B}As$ where $A \neq B$, and a second contact layer 88 of p-GaAs. Laser array 78 is fabricated using the epitaxial liftoff method described previously, wherein a release layer 90 of n-AlAs is deposited on a growth substrate 92. The first contact layer 84 is then deposited on the release layer 90 with the remaining semiconductor layers of the laser array 78 epitaxially deposited on the first contact layer. The release layer 90 will be dissolved in order to detach the laser array 78 from the growth substrate 92. N-impurity induced disordered regions 94 are formed in the laser array 78 extending through the second contact layer 88, the p-DBR 86, the active layer 82 and a portion of the n-DBR 80. Electrical isolating regions 96 are formed on the top surface of the disordered regions.

Between the disordered regions 94 in the laser array 78 are the laser optical cavities 98 consisting of the nondisordered sections of the p-DBR 86, the active layer 82 and the n-DBR 80. The p-DBR 86 is constructed to have a reflectivity as close to one as possible while the n-DBR 80 is constructed with a reflectivity close to one but less than that of the p-DBR 86.

P-contacts 100 are formed on the second contact layer 86, aligned with each laser optical cavity regions 98.

Figure 4B:
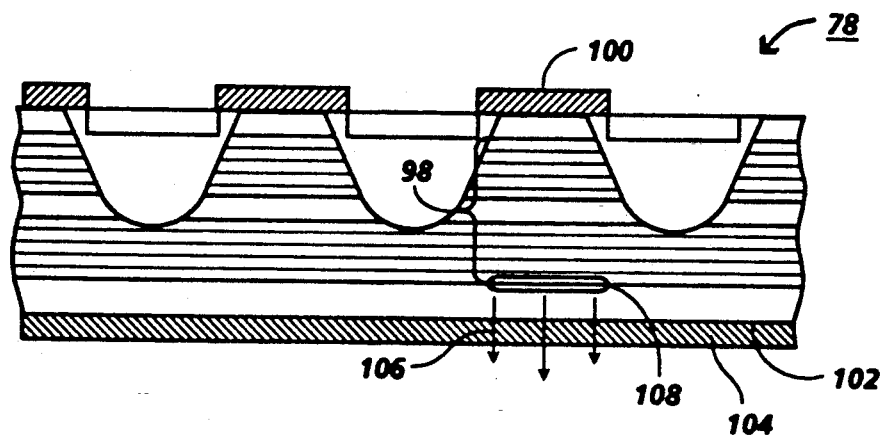

After the p-contacts are formed, the laser array 78 is detached from substrate 92 by dissolving the release layer 90 with dilute hydrofluoric acid. During dissolution, the p-contacts may be protected with wax, for example. After detachment as shown in FIG. 4B, the bottom surface of the first contact layer is exposed.

The bottom surface 102 of the first contact layer 84 is also metallized with Au/Ge followed by Cr-Au or Ti-Pt-Au to form a striped n-contact 104. The contact comprises two stripes running parallel to the row of surface emitters on the bottom surface of the first contact layer, as shown in FIG. 2. The striped contact is referenced to ground. Since laser array 78 has been completely removed from its growth substrate, no additional material must be removed to expose the surface emitting areas at the surface of the first contact layer between the n-contacts.

The p-DBR reflects the light being emitted by the optical cavity active layer toward the p-side of the LED array back through the surface area on the n-side of the LED array, thus enhancing the amount of light emission of the LED array.

The light 106 is emitted through the emitter surface area 108 on the bottom surface 102 of the n-contact 104, substantially perpendicular to the bottom surface 102 of the n-contact 104. Lasing oscillation is established between the n-DBR and the p-DBR which serve as mirrors for the optical cavity.

Optical absorption in the first contact layer 84 may impede emission of the light from the n-DBR of the laser array. To avoid this impediment, the active layer 82 can be made of semiconductor material with a bandgap less than the bandgap of the contact layer. In applications where this is not possible, the contact layer is made as thin as possible as described previously. Alternatively, the contact layer can be removed in the regions of the emitting areas as described previously to facilitate light emission. An anti-reflective coating is not required to coat the n-DBR 80. Since the light is from a laser optical cavity, it is, of course, coherent and can be either continuous wave or pulse.

Typically, the laser array 78 has a threshold current of 1 to 5 milliamperes and an operating current of about 10 milliamperes with an output power of about 1 to 3 milliwatts. Threshold currents of less than 1 milliampere are also possible for the laser array.

Alternatively, the active layer 82 can be in a separate confinement structure to keep the carriers away from the DBR. Also alternatively, the p-confinement layer 18 of FIG. 1, which was replaced by a distributed Bragg reflector (DBR) 86 in FIG. 4, may be coated with a highly reflective metal which serves as an electrically conductive, optical reflector to form a laser cavity.

In FIG. 5, the laser array 110 is of identical structure to the laser array 78 of FIG. 4, except that the n-DBR 80 of FIG. 4 has been replaced with a n-confinement layer 112 and a high reflectivity coating 114 in FIG. 5.

Figure 5A:
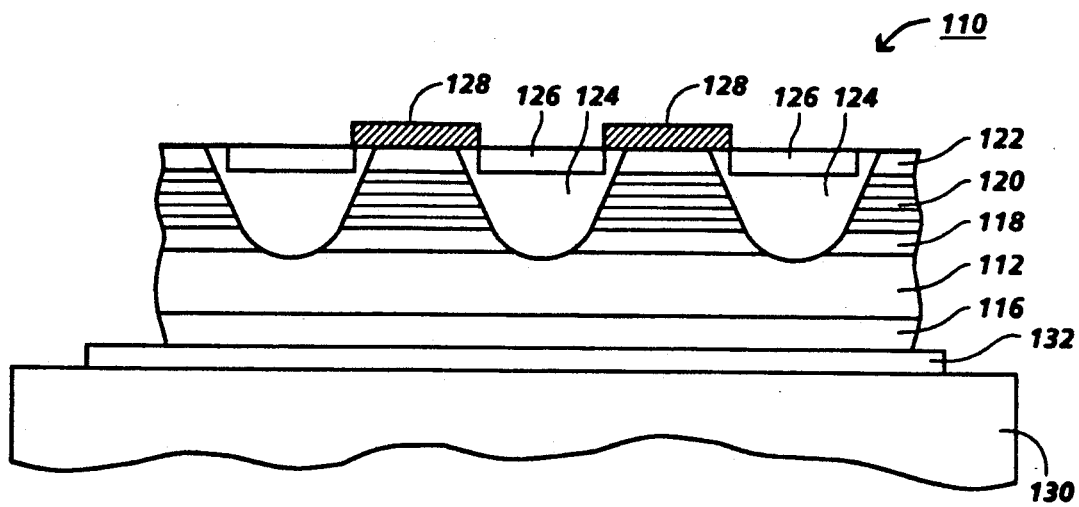
FIGS. 5A and 5B are schematic illustrations of a side view of an alternate embodiment of the high density, Independently addressable, surface emitting, semiconductor laser array without a substrate formed according to this invention.

Laser array 110 of FIG. 5A comprises a first contact layer 116 of n-GaAs upon which is epitaxially deposited a first confinement layer 112 of n-$Al_xGa_{1-x}As$, an active layer 118 of nondoped GaAs for generating light waves, a p-DBR 120 of alternating layers of p-$Al_yGa_{1-y}As$ and p-$Al_zGa_{1-z}As$ where $z \neq y$, and a second contact layer 122 of p-GaAs. N-impurity induced disordered regions 124, electrical isolating regions 126, and p-contacts 128 are formed as described previously.

Figure 5B:
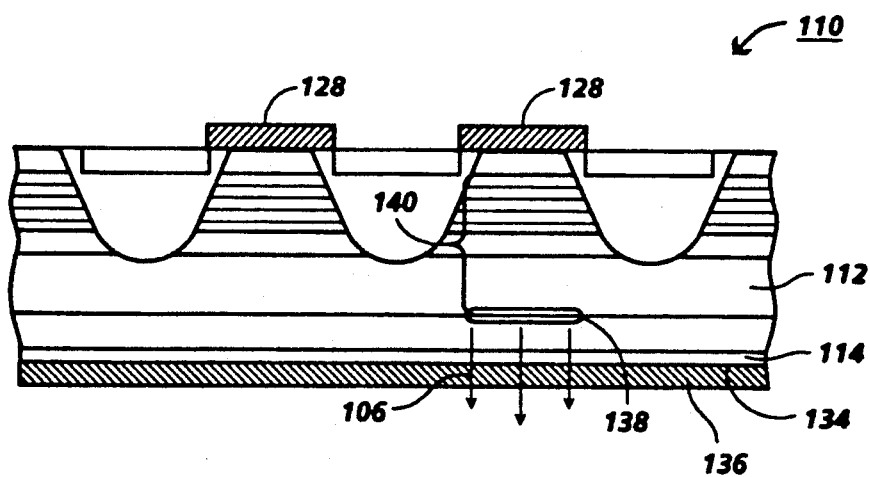

After the p-contacts are formed, the laser array is detached from substrate 130 by dissolving the release layer 132 with dilute hydrofluoric acid. During dissolution, the p-contacts may be protected with wax, for example. After detachment as shown in FIG. 5B, the bottom surface 134 of the first contact layer 116 is exposed and metallized with Au/Ge followed by Cr-Au or Ti-Pt-Au to form a striped n-contact 136. The contact comprises two stripes running parallel to and on either side of the row of surface emitters on the bottom surface of the first contact layer, as shown in FIG. 2. If required, the contact layer can be removed in the regions of the emitting areas as described previously to facilitate light emission.

The high reflectivity coating 114 is deposited by evaporation on the exposed surface of the n-contact layer 116. The coating covers the surface emitting areas 138 and forms one end of the laser optical cavity 140. The high reflectivity coating is typically a multilayer stack of materials such as silicon and aluminum oxide as is known in the art. Alternate materials for the multilayer stack would include alternating layers of $SiO_2$ and $Si_3N_4$ or $SiO_2$ and $ZrO_2$.

Alternatively, the active layer 118 can be in a separate confinement structure to keep the carriers away from the DBR. The p-confinement layer 18 of FIG. 1, which was replaced by a distributed Bragg reflector (DBR) 120 in FIG. 5, may instead be coated with a highly reflective metal to serve as an electrically conductive optical reflector.

In FIG. 6, the laser array 142 is of identical structure to the laser array 78 of FIG. 4, except that a refractive layer 144 is deposited between the first contact layer 146 and the n-DBR 148.

Figure 6A:
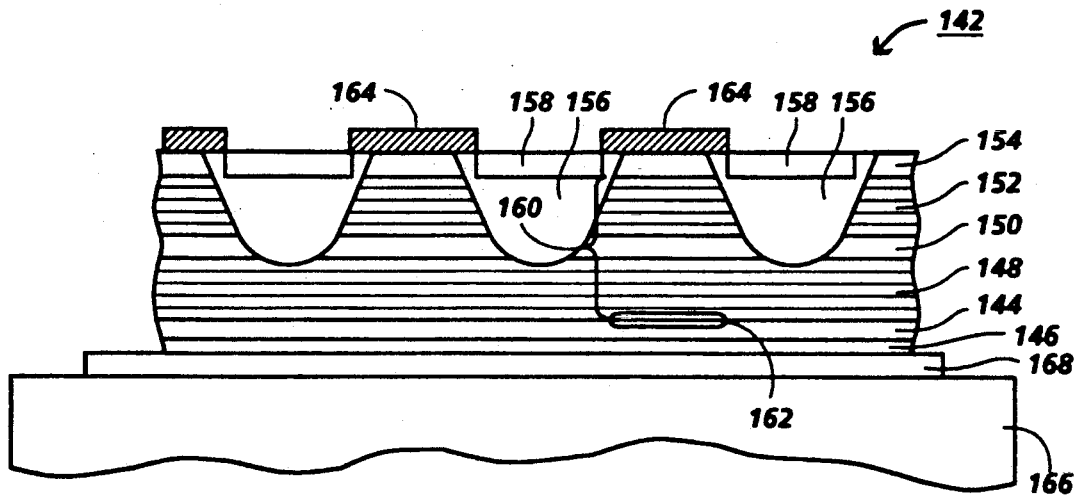
FIGS. 6A and 6B are schematic illustrations of a side view of an alternate embodiment of the high density, independently addressable, surface emitting, semiconductor laser array with overlapping light emission and no substrate formed according to this invention.

Laser array 142 of FIG. 6A comprises a first contact layer 146 of n-GaAs upon which is epitaxially deposited a refractive layer 144 of $n-Al_yGa_{1-y}As$, an n-DBR 148 of alternating layers of $n-Al_xGa_{1-x}As$ and $n-Al_yGa_{1-y}As$ where $x \neq y$, an active layer 150 of nondoped GaAs for generating light waves, a p-DBR 152 of alternating layers of $p-Al_xGa_{1-x}As$ and $p-Al_yGa_{1-y}As$ where $x \neq y$, and a second contact layer 154 of p-GaAs. The laser array further comprises n-impurity induced disordered regions 156 and electrical isolating regions 158.

The laser optical cavity 160 consists of the nondisordered sections of the p-DBR 152, active layer 150, and n-DBR 148. The emitter surface areas 162 are the interface surface between the n-DBR 148 and the refractive layer 144. P-contacts 164 are formed on the second contact layer 154.

Figure 6B:
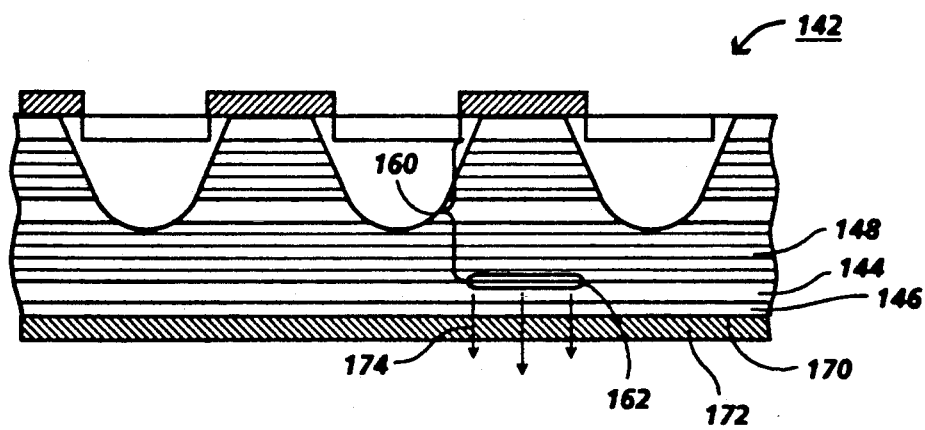

After the p-contacts are formed, the laser array is detached from substrate 166 by dissolving the release layer 168 with dilute hydrofluoric acid. During dissolution, the p-contacts may be protected with wax, for example. After detachment as shown in FIG. 6B, the bottom surface 170 of the first contact layer 146 is exposed and metallized with Au/Ge followed by Cr-Au or Ti-Pt-Au to form a striped n-contact 172. The contact comprises two stripes running parallel to and on either side of the row of surface emitters on the bottom surface of the first contact layer, as shown in FIG. 2. If required, the contact layer can be removed in the regions of the emitting areas as described previously to facilitate light emission.

The refractive layer 144 is transparent to light emitted from the laser optical cavity 160 through the emitter surface areas 162 but the refractive layer diverges the light 174 emitted from the laser cavity increasing the spot size of the emitting area on the exposed surface of the refractive layer or the n-contact layer. The refractive layer should be thick enough to give the appropriate expansion of the spot size. A 5 to 10 micron thick refractive layer, for example, should double the size of the spot.

Increasing the thickness of the refractive layer 144 increases the refractive power, diverges the angle of the emitted light further and increases the output spot size. Selection of an appropriate thickness for the refractive layer will result in partially overlapping output spots of emitted light between adjacent laser optical cavities of adjacent laser elements. Fabricating the surface emitter area in an elliptical shape, for example, will further facilitate overlapping the diverging emitted light in the short axis direction of the ellipse. Such overlapping is pertinent to printing where controlled overlap from line to line or spot to spot may be desirable.

One advantage to the refractive layer is that no phase coherence is introduced between adjacent laser emitters. Consequently, the overlapping beams can be used without any optical interference effects.

Although the light emitted from the LED array and the enhanced LED array are not coherent, the refractive layer of AlGaAs can still be used to diverge the light emitted from the array, although it would not be as effective as with light emitted from a laser since the radiation pattern from an LED is lambertian.

As shown in FIG. 7, laser array 176 is fabricated in the identical fashion to laser array 78 of FIG. 4 except that fresnel lenses 178 are formed on the exposed n-contact layer 180 over the emitter surface areas 182. Thus, laser array 176 has a striped n-contact 184 on either side of the row of exposed emitting areas 182 on the bottom surface 180 of the n-contact layer 186. A fresnel lens 178 is formed for each individual laser element by ion milling or reactive ion etching or other means as is known in the art. Each lens can be shaped to magnify the spot size of the emitted light, change the direction of the emitted light or otherwise alter the emitted light optically. The lateral shape of the lens can be formed to match the transverse shape of the optical cavity.

Again, although the light emitted from the LED array and the enhanced LED array is not coherent, the fresnel lenses can still be used to collimate, diverge, focus or otherwise modify the light emitted from the array by forming the lenses in the n-confinement layer or n-contact layer over the emitter surface areas, although it would not be as effective as with light emitted from a laser since the radiation pattern from a LED is lambertian. Fresnel lenses can also be formed in the refractive layer of FIG. 6 over the emitter surface areas.

As shown In FIG. 8, a laser array 188 is fabricated in the identical fashion to laser array 78 of FIG. 4 except that an array 190 of micro lenses 192 are positioned flush with the exposed surface 194 of the n-contact layer 196. Each micro lens 192 is aligned with an emitter surface area 194. The laser array 188 has a striped n-contact 198 comprising two stripes running parallel to and on either side of the row of surface emitters on the bottom surface of the first contact layer, as shown in FIG. 2. If required, the contact layer can be removed in the regions of the emitting areas as described previously to facilitate light emission. The micro lens array 190 is positioned within the exposed area.

Each micro lens 192 in the array is formed for each individual laser element by means as is known in the art. Each micro lens can be shaped to magnify the spot size of the emitted light, change the direction of the emitted light or otherwise modify the emitted light optically. The lateral shape of the micro lens can be formed to match the transverse shape of the optical cavity.

Alternatively, the micro lens array can be positioned adjacent to the emitter surface areas of the laser array to magnify the size and spacing of the light emitting areas. By way of illustration, a 3 micron spaced array over a 3 centimeter distance with an optical magnification of 7 will result in 1200 spots per inch over a pagewidth of 8.5 inches. Similarly, a 4.5 micron spacing of an array will yield 800 spots per inch for a pagewidth.

Although the light emitted from the LED array and the enhanced LED array is not coherent, the micro lens array can still be used to collimate, diverge, focus or otherwise modify the light emitted from the LED or enhanced LED array by positioning the micro lens array over the emitter surface areas. However the micro lens array would not be as effective as with light emitted from a laser since the radiation pattern from a LED is lambertian. A micro lens array can also be used with the emitting surface areas of the refractive layer of FIG. 6.

The driver circuitry for the p-contacts and the necessary bonding pads can be fabricated on a silicon chip, not shown, placed flush against the top surface of the LED or laser array. The silicon chip need not be optically transparent since the light emission will be from the other surface of the LED or laser array. Alternatively, electronic driver circuitry can be fabricated on the semiconductor LED or laser array or separate and adjacent to the array or on or in the n-confinement layer or n-DBR of the semiconductor array. Since the p-contact is directly below the active region and the light is emitted from the surface of the n-side of the array, the full cross-sectional area of the array is used for heat dissipation.

Figure 9:
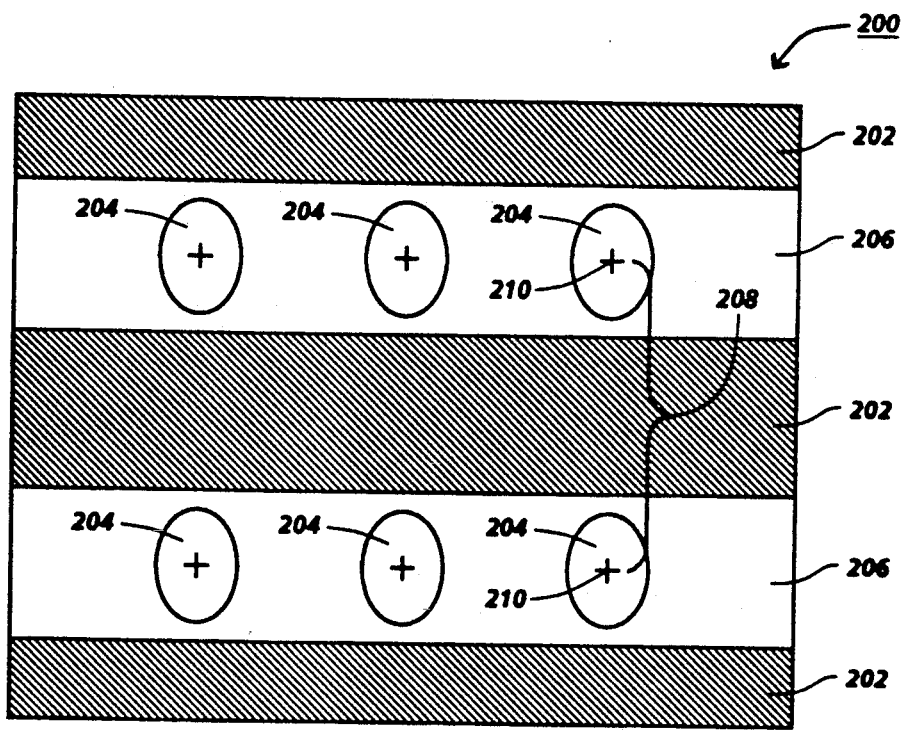
FIG. 9 is a schematic illustration of a bottom view of an alternate embodiment of a two-dimensional, high density, independently addressable, surface emitting, semiconductor laser array without a substrate formed according to this invention.

In FIG. 9, a two-dimensional array 200 is fabricated in the identical fashion to laser array 78 of FIG. 4 except that linear arrays of FIG. 4 are formed adjacent to each other. Thus, the two-dimensional array 200 has stripe n-contacts 202 on either side of the exposed elliptical emitting areas 204 on the surface of n-contact layer 206. The spacing 208 between the center 210 of one individual laser element in one linear array row to the center 210 of one corresponding individual laser element in the next linear array row as measured from the emitter surface areas 204 is typically 9 to 18 microns which provides for a high density of laser elements in the two-dimensional array.

Two-dimensional arrays of surface emitters can be used to simultaneously expose several lines or sequential interlacing of the printed lines. In combination with a refractive layer, two-dimensional arrays can provide optimum overlap of scanning lines. The two-dimensional array is also not restricted to linear rows and columns of surface emitters but the surface emitter layout can be staggered or offset.

The two-dimensional laser array is by way of illustration. The LED and enhanced LED arrays can also be fabricated into a two-dimensional array. Refractive layers, fresnel lens and micro lens arrays, as previously, discussed can also be used with a two-dimensional array.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A high density, surface emitting, semiconductor light emitting diode (LED) array comprising:
   a first semiconductor confinement layer deposited on a first semiconductor contact layer, said first confinement layer and said first contact layer having the same conductivity type,
   an active semiconductor layer deposited on said first confinement layer, said active layer providing lightwave generation and propagation, said active layer having a smaller bandgap than said first confinement layer,
   a second semiconductor confinement layer deposited on said active layer, said second confinement layer having a conductivity type opposite that of said first confinement layer,
   a second semiconductor contact layer deposited on said second semiconductor confinement layer, said second contact layer and said second confinement layer having the same conductivity type,
   disordered regions extending through said second contact layer, said second confinement layer, said active layer and at least partially through said first confinement layer, said disordered regions having a conductivity type opposite that of said contact layer and said second confinement layer,
   at least one contact formed on said first contact layer, and
   light emitting areas formed between said disordered regions, contacts formed on said second contact layer, one of said contacts formed on said second contact layer aligned with each of said light emitting areas such that current injected between one of said contacts on said second contact layer and said at least one contact on said first contact layer will cause light emission from one of said light emitting areas through that portion of the surface of said first contact layer where said contact is not formed on said first contact layer.

2. The high density, surface emitting, semiconductor light emitting diode (LED) array of claim 1 wherein said first contact layer, said first confinement layer and said disordered regions have n-type conductivity and said second confinement layer and said second contact layer have p-type conductivity.

3. The high density, surface emitting, semiconductor light emitting diode (LED) array of claim 1 wherein said light emitting areas comprise the nondisordered portions of the second confinement layer, the nondisordered portions of the active layer and the nondisordered portions of the first confinement layer between adjacent said disordered regions.

4. The high density, surface emitting, semiconductor light emitting diode (LED) array of claim 1 wherein an electrically insulating region is formed on each of said disordered regions.

5. The high density, surface emitting, semiconductor light emitting diode (LED) array of claim 1 further comprising
   a refractive semiconductor layer deposited on said first contact layer,
   said first semiconductor confinement layer deposited on said refractive layer,
   said light emission from one of said light emitting areas passes through the surface of said refractive layer.

6. The high density, surface emitting, semiconductor light emitting diode (LED) array of claim 1 further comprising
   a third semiconductor confinement layer deposited on said first confinement layer,
   said active layer deposited on said third semiconductor confinement layer,
   a fourth semiconductor confinement layer deposited on said active layer, and
   said second semiconductor confinement layer deposited on said fourth semiconductor confinement layer, wherein said third and fourth confinement layers have bandgaps intermediate between the bandgaps of said active layer and said first and second confinement layers.

7. The high density, surface emitting, semiconductor light emitting diode (LED) array of claim 1 further comprising
   an anti-reflective coating on said surface portion of said first contact layer.

8. The high density, surface emitting, semiconductor light emitting diode (LED) array of claim 1 further comprising
   fresnel lenses etched over said light emitting areas on said surface of said first contact layer.

9. The high density, surface emitting, semiconductor light emitting diode (LED) array of claim 1 further comprising
   a micro lens array positioned over said light emitting areas on said surface of said first contact layer.

10. The high density, surface emitting, semiconductor light emitting diode (LED) array of claim 1 wherein said light emitting areas form a two-dimensional array.

11. A high density, surface emitting, semiconductor light emitting diode (LED) array comprising:
    a first semiconductor confinement layer deposited on a first semiconductor contact layer, said first confinement layer and said first contact layer having the same conductivity type,
    an active semiconductor layer deposited on said first confinement layer, said active layer providing lightwave generation and propagation, said active layer having a smaller bandgap than said first confinement layer,
    alternating semiconductor layers deposited on said active layer, said alternating layers forming a distributed Bragg reflector (DBR), said DBR having a conductivity type opposite to said first confinement layer and said first contact layer,
    a second semiconductor contact layer deposited on said DBR, said second contact layer and said DBR having the same conductivity type,
    disordered regions extending through said second contact layer, said DBR, said active layer and at least partially through said first confinement layer, said disordered regions having a conductivity type opposite that of said second contact layer and said DBR,
    at least one contact formed on said first contact layer, and
    light emitting areas formed between said disordered regions, contacts formed on said second contact layer, one of said contacts formed on said second contact layer aligned with each of said light emitting areas such that current injected between one of said contacts on said second contact layer and said at least one contact on said first contact layer will cause light emission from one of said light emitting areas through that portion of the surface of said first contact layer where said contact is not formed on said first contact layer.

12. The high density, surface emitting, semiconductor light emitting diode (LED) array of claim 11 wherein said first contact layer, said first confinement layer and said disordered regions have n-type conductivity and said DBR and said second contact layer have p-type conductivity.

13. The high density, surface emitting, semiconductor light emitting diode (LED) array of claim 11 wherein said light emitting areas comprise the nondisordered portions of the DBR, the nondisordered portions of the active layer and the nondisordered portions of the first confinement layer between adjacent said disordered regions.

14. The high density, surface emitting, semiconductor light emitting diode (LED) array of claim 11 wherein an electrically insulating region is formed on each of said disordered regions.

15. The high density, surface emitting, semiconductor light emitting diode (LED) array of claim 11 further comprising
    a refractive semiconductor layer deposited on said first contact layer,
    said first semiconductor confinement layer deposited on said refractive layer,
    said light emission from one of said light emitting areas passes through the surface of said refractive layer.

16. The high density, surface emitting, semiconductor light emitting diode (LED) array of claim 11 further comprising
    a second semiconductor confinement layer deposited on said first confinement layer,
    said active layer deposited on said second semiconductor confinement layer,
    a third semiconductor confinement layer deposited on said active layer, and
    said DBR deposited on said third semiconductor confinement layer, wherein said second and third confinement layers have bandgaps intermediate between the bandgaps of said active layer, and said first confinement layer and said DBR.

17. The high density, surface emitting, semiconductor light emitting diode (LED) array of claim 11 further comprising
    an anti-reflective coating on said surface portion of said first contact layer.

18. The high density, surface emitting, semiconductor light emitting diode (LED) array of claim 11 further comprising
    fresnel lenses etched over said light emitting areas on said surface of said contact layer.

19. The high density, surface emitting, semiconductor light emitting diode (LED) array of claim 11 further comprising
    a micro lens array positioned over said light emitting areas on said surface of said contact layer.

20. The high density, surface emitting, semiconductor light emitting diode (LED) array of claim 11 wherein said light emitting areas form a two-dimensional array.

21. A high density, surface emitting, semiconductor laser array comprising:
    alternating semiconductor layers forming a first distributed Bragg reflector (DBR) deposited on a first semiconductor contact layer, said first contact layer and first DBR having the same conductivity type, an active semiconductor layer deposited on said first DBR, said active layer providing lightwave generation and propagation under lasing conditions, said active layer having a smaller bandgap than said first DBR, alternating semiconductor layers deposited on said active layer, said alternating layers forming a second distributed Bragg reflector (DBR), said second DBR having a conductivity type opposite to said first DBR, a second semiconductor contact layer deposited on said second DBR, said second contact layer and said second DBR having the same conductivity type, disordered regions extending through said second contact layer, said second DBR, said active layer and at least partially through said first DBR, said disordered regions having a conductivity type opposite that of said second contact layer and said second DBR, at least one contact formed on said first contact layer, and optical cavities formed between said disordered regions, contacts formed on said second contact layer, one of said contacts formed on said second contact layer aligned with each of said optical cavities such that current injected between one of said contacts on said second contact layer and said at least one contact on said first contact layer will cause light emission from one of said optical cavities through that portion of the surface of said first contact layer where said contact is not formed on said contact layer.

22. The high density, surface emitting, semiconductor laser array of claim 21 wherein said first contact layer, said first DBR and said disordered regions have n-type conductivity and said second DBR and said second contact layer have p-type conductivity.

23. The high density, surface emitting, semiconductor laser array of claim 21 wherein said optical cavities comprises the nondisordered portions of the second DBR, the nondisordered portions of the active layer and the nondisordered portions of the first DBR between adjacent said disordered regions.

24. The high density, surface emitting, semiconductor laser array of claim 21 wherein an electrically insulating region is formed on each of said disordered regions.

25. The high density, surface emitting, semiconductor laser array of claim 21 further comprising
a refractive semiconductor layer deposited on said first contact layer,
said first DBR deposited on said refractive layer,
said light emission from one of said optical cavities passes through the surface of said refractive layer.

26. The high density, surface emitting, semiconductor laser array of claim 21 further comprising
a first semiconductor confinement layer deposited on said first DBR,
said active layer deposited on said first semiconductor confinement layer,
a second semiconductor confinement layer deposited on said active layer, and
said second DBR deposited on said second semiconductor confinement layer, wherein said first and second confinement layers have bandgaps intermediate between the bandgaps of said active layer and said first and second DBRs.

27. The high density, surface emitting, semiconductor laser array of claim 21 further comprising
fresnel lenses etched over said optical cavities on said surface of said first contact layer.

28. The high density, surface emitting, semiconductor laser array of claim 21 further comprising
a micro lens array positioned over said optical cavities on said surface of said first contact layer.

29. The high density, surface emitting, semiconductor laser array of claim 21 wherein said optical cavities form a two-dimensional array.

30. A high density, surface emitting, semiconductor laser array comprising:
a first semiconductor confinement layer deposited on a first semiconductor contact layer, said first contact layer and said first confinement layer having the same conductivity type, an active semiconductor layer deposited on said first confinement layer, said active layer providing lightwave generation and propagation under lasing conditions, said active layer having a smaller bandgap than said first confinement layer, alternating semiconductor layers deposited on said active layer, said alternating layers forming a distributed Bragg reflector (DBR), said DBR having a conductivity type opposite to said first confinement layer and said first contact layer, a second semiconductor contact layer deposited on said DBR, said second contact layer and said DBR having the same conductivity type, disordered regions extending through said second contact layer, said DBR, said active layer and at least partially through said first confinement layer, said disordered regions having a conductivity type opposite that of said second contact layer and said DBR, a high reflectivity coating deposited on a portion of surface of said first contact layer, at least one contact formed on said first contact layer where said high reflectivity coating is not deposited on said first contact layer, and optical cavities formed between said disordered regions, contacts formed on said second contact layer, one of said contacts formed on said second contact layer aligned with each of said optical cavities such that current injected between one of said contacts on said second contact layer and said at least one contact on said first contact layer will cause light emission from one of said optical cavities through that portion of the surface of said first contact layer where said high reflectivity coating is deposited on said first contact layer.

31. The high density, surface emitting, semiconductor laser array of claim 30 wherein said first contact layer, said first confinement layer and said disordered regions have n-type conductivity and said DBR and said contact layer have p-type conductivity.

32. The high density, surface emitting, semiconductor laser array of claim 30 wherein said optical cavities comprises the nondisordered portions of the DBR, the nondisordered portions of the active layer and the nondisordered portions of the first confinement layer between adjacent said disordered regions.

33. The high density, surface emitting, semiconductor laser array of claim 30 wherein an electrically insulating region is formed on each of said disordered regions.

34. The high density, surface emitting, semiconductor laser array of claim 30 further comprising
a refractive layer deposited on said first contact layer, said light emission from one of said optical cavities passes through the surface of said refractive layer.

35. The high density, surface emitting, semiconductor laser array of claim 30 further comprising
a second semiconductor confinement layer deposited on said first confinement layer,
said active layer deposited on said second semiconductor confinement layer,
a third semiconductor confinement layer deposited on said active layer, and
said DBR deposited on said third semiconductor confinement layer, wherein said second and third confinement layers have bandgaps intermediate between the bandgaps of said active layer, and said first confinement layer and said DBR.

36. The high density, surface emitting, semiconductor laser array of claim 30 further comprising
fresnel lenses etched over said optical cavities on said surface of said first contact layer.

37. The high density, surface emitting, semiconductor laser array of claim 30 further comprising
a micro lens array positioned over said optical cavities on said surface of said first contact layer.

38. The high density, surface emitting, semiconductor laser array of claim 30 wherein said optical cavities form a two-dimensional array.

* * * * *